US007093217B1

(12) United States Patent
Signore et al.

(10) Patent No.: US 7,093,217 B1
(45) Date of Patent: Aug. 15, 2006

(54) METHOD AND APPARATUS FOR DETERMINING THE OPTIMAL FANOUT ACROSS A LOGIC ELEMENT

(75) Inventors: Nicholas D. Signore, Arlington, MA (US); Curtis A. Wickman, Arlington, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 276 days.

(21) Appl. No.: 10/699,709

(22) Filed: Nov. 3, 2003

(51) Int. Cl.
G06F 9/45 (2006.01)
(52) U.S. Cl. .................................. 716/5; 716/2; 716/8
(58) Field of Classification Search .................. 716/5, 716/2, 8
See application file for complete search history.

(56) References Cited

U.S. PATENT DOCUMENTS

| | | | |
|---|---|---|---|
| 6,629,301 B1 | 9/2003 | Sutherland et al. | 716/8 |
| 6,725,438 B1* | 4/2004 | van Ginneken | 716/10 |
| 2003/0088842 A1* | 5/2003 | Cirit | 716/9 |
| 2004/0130349 A1* | 7/2004 | Morgenshtein et al. | 326/112 |

OTHER PUBLICATIONS

Rezvani et al., "LEOPARD: a Logical Effort-based fanout OPtimizer for ARea and Delay", Nov. 1999, IEEE/ACM International Conference on Computer-Aided Design, Digest of Technical Papers, pp. 516-519.*
Wei Chen, Cheng Ta Hsieh, Massoud Pedram, "Simultaneous Gate Sizing and Fanout Optimization", Nov. 2000, Proceedings of the 2000 IEEE/ACM international conference on Computer-aided design.*
Ivan E. Sutherland, Jon K. Lexau, "Designing Fast Asynchronous Circuits", Mar. 2001, Proceedings of the 7th International Symposium on Asynchronous Circuits and Systems.*
Sutherland et al., Logical Effort Designing Fast CMOS Circuits, 1999.

* cited by examiner

*Primary Examiner*—Vuthe Siek
*Assistant Examiner*—Tuyen To
(74) *Attorney, Agent, or Firm*—Park, Vaughan & Fleming LLP

(57) ABSTRACT

A method of determining an optimal transistor fanout. The method includes creating a sizing model by replacing at least one logic element in a circuit description with a sizing element that includes a dynamic resistor. The method also includes determining a steady state solution to the sizing model and determining at least one transistor fanout from the steady state solution.

22 Claims, 4 Drawing Sheets

METHOD AND APPARATUS FOR DETERMINING THE OPTIMAL FANOUT ACROSS A LOGIC ELEMENT

1. FIELD OF THE INVENTION

Figure 1:
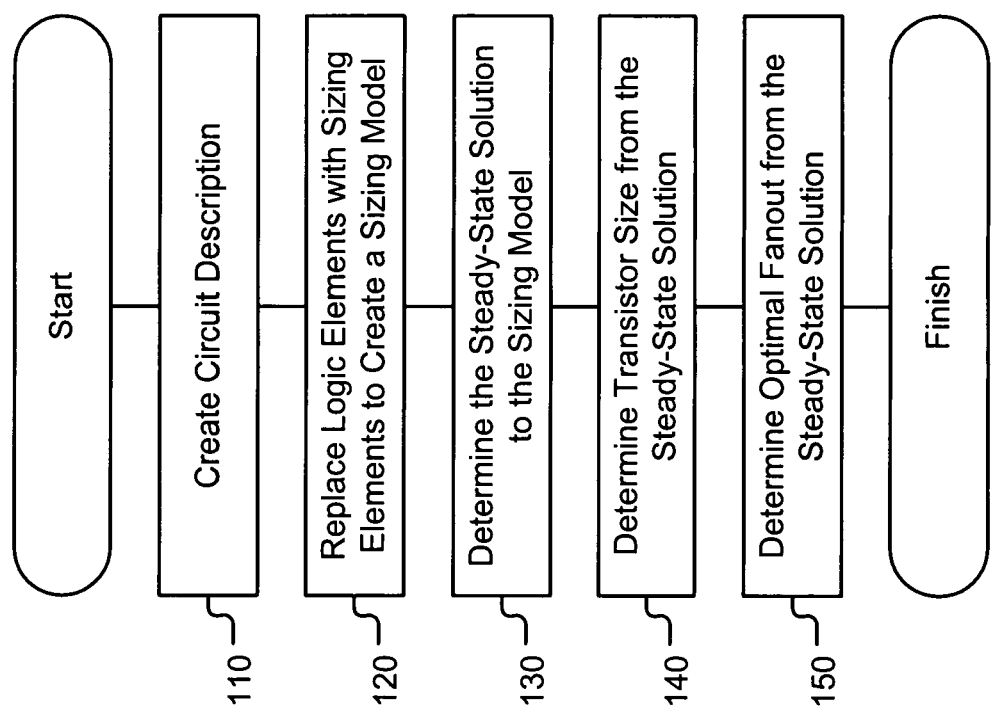

The present invention generally relates to methods of designing integrated circuits. More specifically, the present invention relates to methods of designing integrated circuits that include performing a logical effort analysis that determines the optimal fanout across logic stages.

2. BACKGROUND

Integrated circuit ("IC") design consists of a number of steps. Typically, the design starts with a specification of the functional performance characteristics of the IC. The IC is then typically broken down into more manageable blocks so that the blocks may be divided among multiple designers and analyzed in pieces by computer aided design tools. Next, logic designers write register transfer level ("RTL") descriptions of each block. Next, floor plans are created for each of the blocks. After verifying that the RTL descriptions are accurate, the designers estimate the size of each block. Then designers create a floor plan that describes the relative placement of the blocks on the IC. Finally, the designers layout the actual circuits of each block.

One of the difficult challenges for a designer is sizing the circuit so that the circuit meets timing constraints. Without a systematic approach, designers resort to continually simulating and modifying the design to achieve the timing constraints.

One way to assist designers in meeting timing criteria is provided by a method of logical effort. The method of logical effort is an efficient way to determine more optimal transistor sizes thus reducing delay in a complementary metal oxide semiconductor ("CMOS") circuit.

According to the method of logical effort, the delay incurred by a logic gate is comprised of two components. The first component is known as "parasitic delay." The second component, known as "effort delay," is proportional to the load on the logic gate's output. The effort delay is equal to the "logical effort" multiplied by the "electrical effort." As discussed below, logical effort characterizes the properties of the logic gates and electrical effort characterizes the load.

Logical effort is a unitless parameter defined so that an inverter has a logical effort of one. The logical effort of several common gates, assuming a beta ratio (pull-up transistor width/pull-down transistor width) of 2, is shown in the following table:

| Gate type | Number of inputs | | | | | |
|---|---|---|---|---|---|---|
| | 1 | 2 | 3 | 4 | 5 | n |
| Inverter | 1 | | | | | |
| NAND | | 4/3 | 5/3 | 6/3 | 7/3 | (n + 2)/3 |
| NOR | | 5/3 | 7/3 | 9/3 | 11/3 | (2n + 1)/3 |
| Multiplexer | | 2 | 2 | 2 | 2 | 2 |
| XOR (parity) | | 4 | 12 | 32 | | |

In general, the logical effort of a logic element describes how much worse the logic gate is at driving an output load when compared to an inverter. Accordingly, the logical effort of a gate indicates how much more slowly the logic gate will drive a load than would an inverter.

The electrical effort can be defined as the ratio of the capacitance that loads the output of the logic gate divided by the capacitance presented by the input terminal of the logic gate.

In summary, the effort delay incurred by a logic gate can be stated as:

effort delay=(logical effort)(electrical effort)+parasitic delay

The method of logical effort analysis is described more completely in *Logical Effort: Designing Fast CMOS Circuits*, by Ivan Sutherland, Bob Sproull, and David Harris, Morgan Kaufmann Publishers, Inc. (1999), ISBN # 1-55860-557-6.

3. SUMMARY OF THE INVENTION

One embodiment of the invention is a method of determining an optimal transistor fanout. The method includes creating a sizing model by replacing at least one logic element in a circuit description with a sizing element that includes a dynamic resistor. The method also includes determining a steady state solution to the sizing model and determining at least one transistor fanout from the steady state solution.

Another embodiment of the invention is a device containing machine-readable instructions, that when executed performs the above method. Still another embodiment of the invention is an integrated circuit manufactured utilizing the above method.

4. BRIEF DESCRIPTION OF THE FIGURES

FIG. 1 presents a method of determining a transistor fanout.

Figure 2:
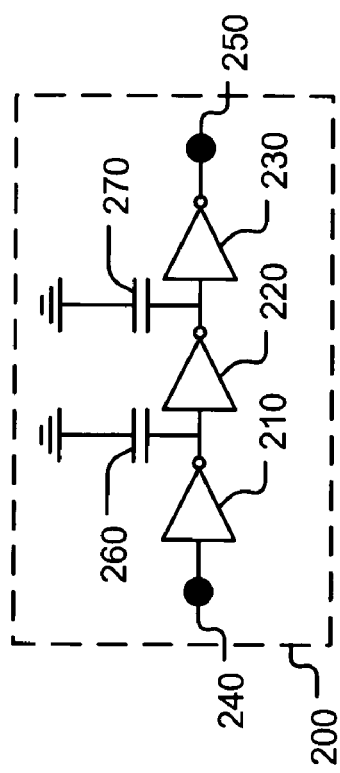

FIG. 2 presents a circuit description of a simple circuit.

Figure 3:
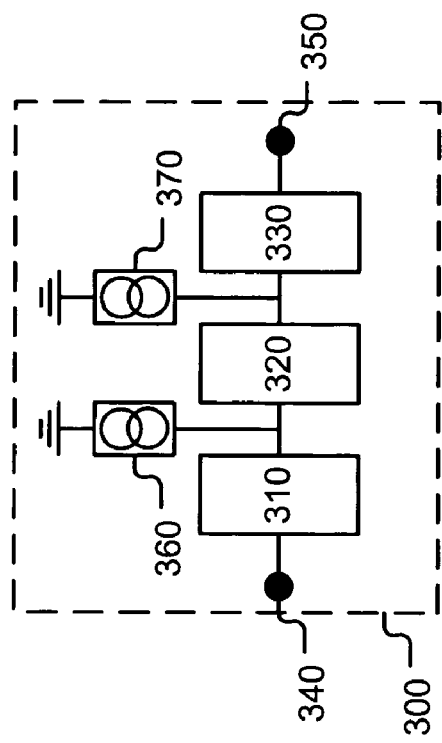

FIG. 3 presents a sizing model that corresponds to the circuit of FIG. 2.

Figure 4:
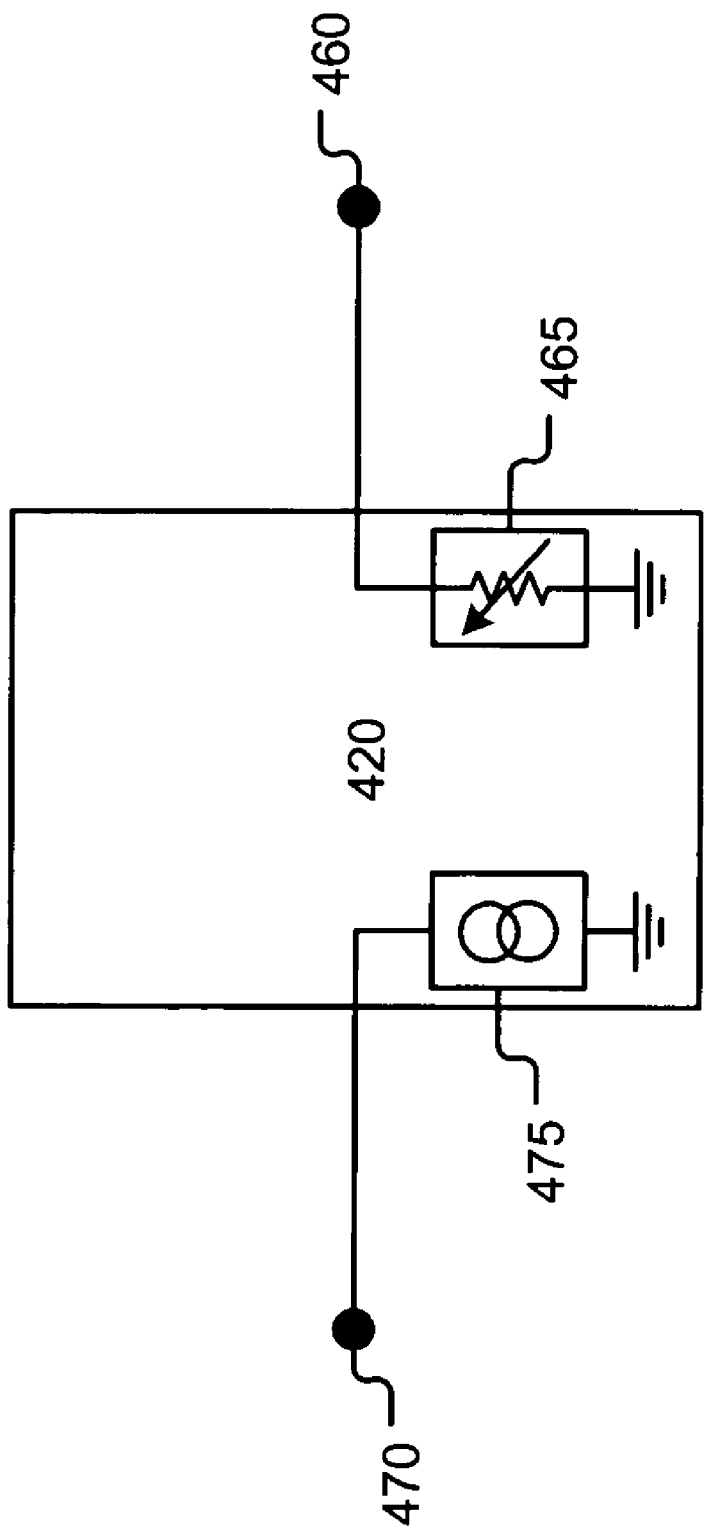

FIG. 4 presents a sizing element.

Figure 5:
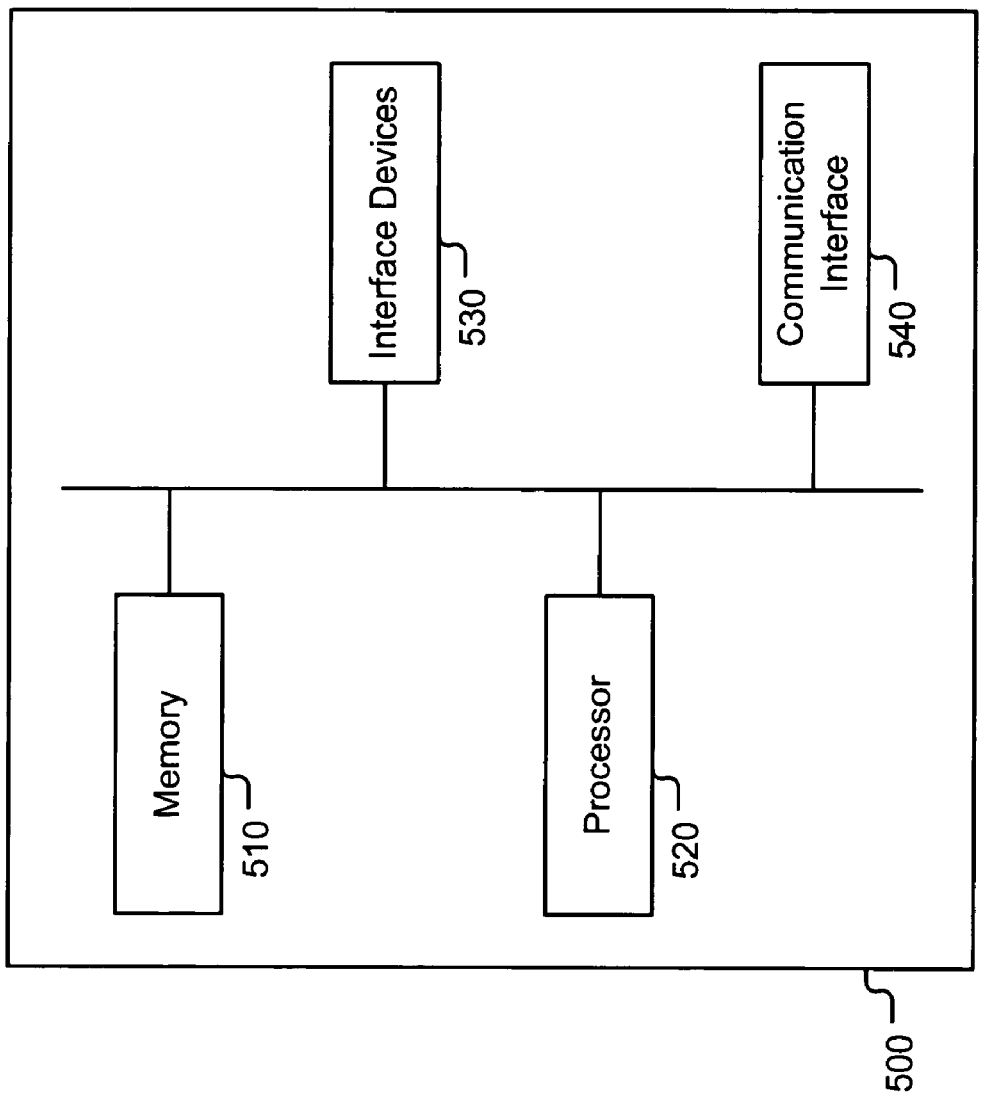

FIG. 5 presents a high-level diagram of a computer system.

5. DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

One embodiment of the invention is a method, shown in FIG. 1, that assists circuit designers to determine the optimal fanout across a stage of logic in an integrated circuit ("IC").

5.1 CREATE A CIRCUIT DESCRIPTION

The first step of the method, as shown in Block 110 of FIG. 1, is creating a circuit description. The circuit description details the various logic elements in a circuit design. In addition, the circuit description details how the logic elements are connected. This step is conventional.

Designers can utilize various well-known tools for creating the circuit description. For example, various schematic capture tools, such "Electric" or schematic capture tools produced by Cadence Design System, Inc., could be utilized to create a circuit description. Alternatively, various automatic circuit tools could create the circuit description based upon a number of functional requirements.

An example of a simple circuit description is shown in FIG. 2. The circuit description 200 includes three inverters 210, 220, and 230. The circuit description includes one input 240 and one output 250. The circuit description also shows that the output of inverter 210 is coupled to the input of inverter 220. Similarly, the output of inverter 220 is coupled to the input of inverter 230.

In some embodiments of the invention, such as shown in FIG. 2, the circuit description could include capacitors, such as capacitors 260 and 270. These capacitors could represent the parasitic capacitance of electrical traces that connect logic elements.

5.2 REPLACE LOGIC ELEMENTS WITH SIZING ELEMENTS

After the circuit description is created, as shown in Block 120 of FIG. 1, each logic element in the circuit is replaced with a sizing element. This step may be performed by an automated tool, by a circuit designer, or by a combination of the two. FIG. 3 presents a "sizing" model in which each logic element in FIG. 2 is replaced with a sizing element. Specifically, inverter 210 is replaced with sizing element 310. Similarly, inverters 220 and 230 are replaced with sizing elements 320 and 330. Sizing model 300 includes one output 350, which corresponds to input 250. In addition, sizing model 300 includes one output 340 that corresponds to input 240. Sizing model 300 may also include current sources, such as current sources 360 and 370, which correspond to capacitors 260 and 270.

FIG. 4 presents a detailed drawing of sizing element 420, which corresponds to sizing element 320. As shown in FIG. 4, sizing element 420 includes a sink terminal 460. This sink terminal 460 is coupled to a sink element 465, which is also coupled to ground. As shown in FIG. 4, the sink element 465 contains a dynamic resistor. So that a variable fanout, i.e., the load of the gates driven by a logic gate divided by the size of the logic gate, can be dynamically modeled, the size of the resistor in sink element 465 is not static. Instead, the size of the resistor dynamically varies based upon one or more values. For example, as discussed in Section 5.3.2, the value of the resistor in sink element 465 can be based upon a number of different variables. As a result, the size of the resistor in sink element 465 can be determined based upon sizing element 310 and/or sizing element 320.

Referring again to FIG. 4, sizing element 420 also contains a source terminal 470. The source terminal 470 is coupled to a constant current source 475, which is also coupled to ground. The current source 475 will deliver a DC current at the first source terminal 470. As discussed in Section 5.3, the current output by the current source 475 can directly correspond to the input capacitance (and hence transistor size) of a logic gate. For example, the current values may be proportional to the input capacitance of an inverter.

5.3 CONFIGURE THE SIZING ELEMENTS

In order to configure sizing elements 310, 320, and 330, the loads and sizes of inverters 210, 220, and 230 need to be determined.

As shown in FIG. 2, inverter 210 drives inverter 220. Thus, using the definition of fanout that was discussed above, the fanout between inverters 210 and 220 can be calculated by the following equation:

$$\text{Fanout}_{210\text{-}220} = \text{Load}_{220}/\text{Size}_{210} \quad \text{(Eq. 1.0)}$$

Where $\text{Load}_{220}$ is equal to the load of inverter 220 and $\text{Size}_{210}$ is equal to the size of inverter 210. Equation 1.0 can be rearranged to solve for $\text{Load}_{220}$.

$$\text{Load}_{220} = \text{Size}_{210} * \text{Fanout}_{210\text{-}220} \quad \text{(Eq. 1.1)}$$

Utilizing the definition of Logical Effort:

$$\text{Size}_{220} = \text{Load}_{220}/\text{Logical Effort}_{220} \quad \text{(Eq. 1.2)}$$

Combining equations 1.1 and 1.2:

$$\text{Size}_{220} = \text{Size}_{210} * \text{Fanout}_{210\text{-}220}/\text{Logical Effort}_{220} \quad \text{(Eq. 1.3)}$$

Again using the definition of fanout, the load of inverter 230, $\text{Load}_{230}$, can be calculated:

$$\text{Load}_{230} = \text{Size}_{220} * \text{Fanout}_{220\text{-}230} \quad \text{(Eq. 1.4)}$$

If $\text{Fanout}_{210\text{-}220}$ is assumed to be equal to $\text{Fanout}_{220\text{-}230}$, $\text{Load}_{230}$ is equal to:

$$\text{Load}_{230} = \text{Size}_{210} * \text{Fanout}^2/\text{Logical Effort}_{220} \quad \text{(Eq. 1.5)}$$

From the definition of logical effort, $\text{Size}_{230}$ is equal to:

$$\text{Size}_{230} = \text{Load}_{230}/\text{Logical Effort}_{230} \quad \text{(Eq. 1.6)}$$

Combining equation 1.5 and 1.6:

$$\text{Size}_{230} = \text{Size}_{210} * \text{Fanout}^2/(\text{Logical Effort}_{220} * \text{Logical Effort}_{230}) \quad \text{(Eq. 1.7)}$$

Using equation 1.7, it is possible to solve for Fanout:

$$\text{Fanout} = \text{sqrt}(\text{Size}_{230} * \text{Logical Effort}_{220} * \text{Logical Effort}_{230}/\text{Size}_{210}) \quad \text{(Eq. 2.0)}$$

Combining equations 1.1 and 2.0:

$$\text{Load}_{220} = \text{Size}_{210} * \text{sqrt}(\text{Size}_{230} * \text{Logical Effort}_{220} * \text{Logical Effort}_{230}/\text{Size}_{210}) \quad \text{(Eq. 3.0)}$$

In order to generate a model that can be efficiently solved using circuit analysis tools, such as SPICE, the following variables are defined:

$$I_{230} = \text{the input capacitance of inverter 230} \quad \text{(Eq. 4.0)}$$

$$V_{210} = \text{Size}_{210} \quad \text{(Eq. 4.1)}$$

$$\text{Fanout} = \text{sqrt}(I_{230} * \text{Logical Effort}_{220}/V_{210}) \quad \text{(Eq. 4.2)}$$

With the above definitions, sizing elements 310, 320, and 330 can now be configured.

5.3.1 Sizing Element 310

Referring to FIG. 2, inverter 210 drives inverters 220 and 230. The size of the sink resistor can be set to the inverse of the fanout ratio of logic gate 210. Alternatively, in some embodiments of the invention, the size of the sink resistor can be set to zero. The current source of sizing element 310 is set to $\text{Size}_{210} * \text{Logical Effort}_{210}$.

5.3.2 Sizing Element 320

Referring to FIG. 2, inverter 220 is driven by inverter 210. Thus, from equation 4.2 above, the value of the sink resistor in sizing element 320 is set to the square root of $(I_{230} * \text{Logical Effort}_{220}/V_{210})$. The current source of sizing element 320 is set to $\text{Size}_{220} * \text{Logical Effort}_{220}$.

5.3.3 Sizing Element 330

Referring to FIG. 2, inverter 230 is driven by inverter 220. However, inverter 230 does not drive another logic gate. Thus, the value of its sink resistor is not important. However, in some embodiments of the invention, the value of the sink resistor is equal to the inverse of the fanout of logic gate 230. The current source of sizing element 320 is set to $Size_{230}*Logical\ Effort_{230}$.

5.4 DETERMINE THE STEADY-STATE SOLUTION TO THE SIZING MODEL

Next, as shown in block 130 of FIG. 1, the steady-state solution of sizing model 300 is determined. Sizing model 300 includes only current sources and resistors, at least one of which is a dynamic resistor. In order to avoid a trivial zero-voltage and zero-current solution, a voltage needs to be applied to sink 350 of sizing element 330. This voltage may represent the capacitance of a fixed load. After the voltage is so applied, the voltages and currents on the various nodes of the sizing model can be easily determined. For example, such voltages and currents can be rapidly determined by hand calculations or by circuit analysis programs, such as SPICE.

5.5 DETERMINE THE TRANSISTOR SIZE FROM THE STEADY-STATE SOLUTION

Next, as shown in block 140 of FIG. 1, the transistor sizes of the logic gates in FIG. 2 can be determined. The resulting voltages and currents on various nodes of the sizing model can be utilized to determine the appropriate sizes of transistors within logic gates 210, 220, and 230. For example, the optimal transistor gate width of inverter 220 can be determined by multiplying the value of the voltage appearing across the resistor in sizing element 320 by the width of a reference transistor utilized in a reference logic gate. In some embodiments of the invention, the reference transistor width is the width of an n-type transistor gate of an inverter with a fixed beta ratio.

Then, as shown in block 150 of FIG. 1, the optimal fanout of one or more logic gates can be determined. For example, the resulting resistor size of sizing element 220 can be utilized to determine the optimal fanout of inverter 220.

5.6 OTHER EMBODIMENTS OF THE INVENTION

While the methods described above utilize only inverters, any type of logic gates, such as AND, NAND, OR, XOR, NOR gates, could be similarly optimized using the methods discussed above.

In addition, in some embodiments of the invention, the dynamic resistor could vary based upon other formulas that are designed to achieve a particular desired result. In still other embodiments of the invention, the dynamic resistor could vary as a piece-wise-linear function based upon the values of one or more variables.

Another embodiment of the invention is a device, such as a hard disk drive, a CD ROM, a DVD ROM, a floppy disk, a flash disk, or a tape, containing machine readable instructions, that when executed, performs portions of one or more of the above described methods.

Still another embodiment of the invention is a computer system programmed to perform portions of one or more of the above described methods. Such a computer system is shown in FIG. 5. In some embodiments of the invention, computer system 500 would include memory 510, one or more processors 520, and interface devices 530, such as keyboards, mice and trackballs. In addition, the computer could include a communication interface 540, such as an Ethernet network interface that allows the computer 500 to communicate with other computers.

Yet another embodiment of the invention is an integrated circuit that is designed utilizing portions of one or more of the above methods.

5.7 CONCLUSION

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

It is claimed:

1. A method of determining a fanout, wherein the fanout is the load of the gates driven by a logic gate divided by the size of at least one transistor in the logic gate, the method comprising:
   a) creating a sizing model by replacing at least one logic element in a circuit description with a sizing element that includes a dynamic resistor, wherein the dynamic resistor is a resistor that dynamically varies based upon one or more values in the sizing model;
   b) determining a steady state solution to the sizing model;
   c) determining the size of the at least one transistor; and
   d) determining the fanout for the at least one transistor from the steady state solution.

2. The method of claim 1, wherein creating a sizing model includes replacing at least one logic element in the circuit description with a sizing element that includes a dynamic resistor the size of which is based at least upon a current.

3. The method of claim 1, wherein creating a sizing model includes replacing at least one logic element in the circuit description with a sizing element that includes a dynamic resistor the size of which is based at least upon the logical effort of a logical element.

4. The method of claim 1, wherein creating a sizing model includes replacing at least one logic element in the circuit description with a sizing element that includes a dynamic resistor the size of which is based at least upon a voltage.

5. The method of claim 1, wherein creating a sizing model includes replacing at least one logic element in the circuit description with a sizing element that includes a dynamic resistor the size of which is based at least upon a current and a voltage.

6. The method of claim 1, wherein creating a sizing model includes replacing at least one logic element in the circuit description with a sizing element that includes a dynamic resistor the size of which is based at least upon the logical effort of a logic element, a current, and a voltage.

7. The method of claim 1, wherein creating a sizing model includes replacing at least one logic element in the circuit description with a sizing element that includes a dynamic resistor the size of which is proportional to the square root of a current.

8. The method of claim 1, wherein creating a sizing model includes replacing at least one logic element in the circuit description with a sizing element that includes a dynamic resistor the size of which is proportional to the square root of the logical effort of a logic element.

9. The method of claim 1, wherein creating a sizing model includes replacing at least one logic element in the circuit description with a sizing element that includes a dynamic resistor the size of which is proportional to the square root of the inverse of a voltage.

10. A device containing machine-readable instructions, that when executed perform a method of determining at least one ratio of the size of a first transistor with respect to the size of a second transistor, the method comprising:
  a) creating a sizing model by replacing at least one logic element in a circuit description with a sizing element that includes a dynamic resistor, wherein the dynamic resistor is a resistor that dynamically varies based upon one or more values in the sizing model;
  b) determining a steady state solution to the sizing model; and
  c) determining the ratio of the size of the first transistor with respect to the size of the second transistor from the steady state solution.

11. The device of claim 10, wherein creating a sizing model includes replacing at least one logic element in the circuit description with a sizing element that includes a dynamic resistor the size of which is based at least upon a current.

12. The device of claim 10, wherein creating a sizing model includes replacing at least one logic element in the circuit description with a sizing element that includes a dynamic resistor the size of which is based at least upon the logical effort of a logical element.

13. The device of claim 10, wherein creating a sizing model includes replacing at least one logic element in the circuit description with a sizing element that includes a dynamic resistor the size of which is based at least upon a voltage.

14. The device of claim 10, wherein creating a sizing model includes replacing at least one logic element in the circuit description with a sizing element that includes a dynamic resistor the size of which is based at least upon a current and a voltage.

15. The device of claim 10, wherein creating a sizing model includes replacing at least one logic element in the circuit description with a sizing element that includes a dynamic resistor the size of which is based at least upon the logical effort of a logic element, a current, and a voltage.

16. The device of claim 10, wherein creating a sizing model includes replacing at least one logic element in the circuit description with a sizing element that includes a dynamic resistor the size of which is proportional to the square root of a current.

17. The device of claim 10, wherein creating a sizing model includes replacing at least one logic element in the circuit description with a sizing element that includes a dynamic resistor the size of which is proportional to the square root of the logical effort of a logic element.

18. The device of claim 10, wherein creating a sizing model includes replacing at least one logic element in the circuit description with a sizing element that includes a dynamic resistor the size of which is proportional to the square root of the inverse of a voltage.

19. An integrated circuit created at least in part by a method of determining at least one ratio of the size of a first transistor with respect to the size of a second transistor, the method comprising:
  a) creating a sizing model by replacing at least one logic element in a circuit description with a sizing element that includes a dynamic resistor, wherein the dynamic resistor is a resistor that dynamically varies based upon one or more values in the sizing model;
  b) determining a steady state solution to the sizing model; and
  c) determining the ratio of the size of the first transistor with respect to the size of the second transistor from the steady state solution.

20. The integrated circuit of claim 19, wherein creating a sizing model includes replacing at least one logic element in the circuit description with a sizing element that includes a dynamic resistor the size of which is based at least upon a current.

21. The integrated circuit of claim 19, wherein creating a sizing model includes replacing at least one logic element in the circuit description with a sizing element that includes a dynamic resistor the size of which is based at least upon the logical effort of a logical element.

22. The integrated circuit of claim 19, wherein creating a sizing model includes replacing at least one logic element in the circuit description with a sizing element that includes a dynamic resistor the size of which is based at least upon a voltage.

* * * * *